United States Patent [19]

Murayama

[11] 3,974,059

[45] Aug. 10, 1976

[54] HIGH VACUUM ION PLATING DEVICE

[76] Inventor: Yoichi Murayama, Tosimaku Mejiro 3 tyome, 17 ban 23 go Mejiro Daiichi Kopo, Tokyo, Japan

[22] Filed: Oct. 3, 1974

[21] Appl. No.: 511,863

[52] U.S. Cl. .............................. 204/298; 118/49.1; 118/49.5
[51] Int. Cl.² ........................................ C23C 15/00
[58] Field of Search .......... 204/192, 298; 118/49.1, 118/49.5; 117/106 R

[56] References Cited
UNITED STATES PATENTS

| | | | |
|---|---|---|---|
| 2,527,747 | 10/1950 | Lewis et al. ..................... | 204/298 X |
| 2,752,882 | 7/1956 | Heimann ........................... | 118/49.1 |
| 3,192,892 | 7/1965 | Hanson et al. ............... | 118/49.1 OR |
| 3,316,386 | 4/1967 | Yaffe et al. .................... | 118/49.1 X |
| 3,428,546 | 2/1969 | Baum et al. ....................... | 204/298 |
| 3,437,734 | 4/1969 | Roman et al. ................ | 118/49.5 X |
| 3,492,215 | 1/1970 | Conant ............................. | 204/192 |
| 3,556,048 | 1/1971 | Frazer .............................. | 118/49.5 |
| 3,583,361 | 6/1971 | Laudel, Jr. ........................ | 118/49.5 |
| 3,761,375 | 9/1973 | Pierce et al. ....................... | 204/298 |
| 3,847,115 | 11/1974 | Tashbar ............................ | 118/49.1 |

Primary Examiner—John H. Mack
Assistant Examiner—Aaron Weisstuch
Attorney, Agent, or Firm—Fred Philpitt

[57] ABSTRACT

A DC high tension is impressed between an evaporation source and a holder containing a substrate to be vacuum plated. The source and substrate holder are disposed in an evaporation chamber of high vacuum. Immediately above the evaporation source, an ion chamber is formed and a voltage is impressed between a filament for electron emission and an anode for current collection. The filament and anode are disposed in the ion chamber to transfer an electron shower between them and the evaporation particles which are ionized by the electron shower.

When more than one evaporation source is employed, a high frequency coil is disposed in the coexistence region of the ionized evaporated particles generated therefrom, whereby a high frequency oscillation region is formed and thus it becomes possible to effect a chemical bond between ionized evaporated particles of different kinds.

2 Claims, 2 Drawing Figures

HIGH VACUUM ION PLATING DEVICE

BACKGROUND OF THE INVENTION

The present invention relates to an improvement of an ion plating device, and more particularly to a high vacuum ion plating device characterized in that an electron shower is applied to the evaporated particles that are moving towards the body to be plated. The particles are generated from an evaporation source whereby the particles are ionized.

Ion plating devices which have been employed conventionally are constructed in such a manner that an evaporation source and a body to be plated are disposed in an evaporation chamber in which an inert gas such as Ar, He and the like is sealed under pressure of about $10^{-1}$ to $10^{-2}$ torr and a DC voltage is impressed between them so that the inert gas is excited by the DC voltage to generate a glow discharge. The particles of an evaporation material being evaporated from the evaporation source are ionized by the glow discharge and then are accelerated in a DC field formed by impression of a DC voltage. The particles are caused to collide with and adhere to the body to be plated.

In the ion plating method mentioned in the foregoing, the particles of evaporated material are ionized and are accelerated in the DC field. Therefore a film formed on the surface of the body to be plated has a high degree of adhesion as compared with a film obtained by ordinary vapor deposition methods. Also, in ion plating, it is possible to select a wide rang of evaporation source materials and materials to be plated.

However, in the conventional ion plating device mentioned in the foregoing, the glow discharge for ionizing the evaporated particles is generated between the evaporation source and the body to be plated. Therefore the body to be plated is not only subjected to the collision of the particles of the evaporated material but also to the collision of the inert gas which is ionized, causing elevated temperatures so that the temperature control of the body to be plated is difficult. Accordingly, it has been almost impossible to use a material having a low heat resistance as the body to be plated. Also, depending upon the conditions during the evaporation process, back sluttering occurs which results in a tendency of generating defects on the film, and moreover the structure and characteristics of the film formed thereby have not necessarily been satisfactory.

SUMMARY OF THE INVENTION

Consequently, an object of the present invention is to eliminate the foregoing various disadvantages that accompany the use of an inert gas by replacing the conventional inert gas atmosphere with a high vacuum in the evaporation chamber and also with the use of an electron shower for ionization of the evaporated particles.

Another object of the present invention is to improve the efficiency of ionization of the evaporated particles by carrying out the ionization of the evaporation particles by the electron shower in an ionization chamber disposed in the evaporation chamber.

Yet another object of the present invention is to permit formation of a compound film of evaporated particles resulting from a plurality of different kinds of evaporation sources on the surface of the body to be plated.

A still further object of the present invention is to adhere the compound particles on the surface of the body to be plated by disposing a plurality of different kinds of evaporation sources in the evaporation chamber and ionizing the evaporated particles resulting from the sources and effecting the chemical reaction of the ionized particles by means of high frequency excitation energy.

Yet another object of the present invention is to facilitate the control of the range of the evaporation of the evaporated particles and the amount of evaporation by disposing a shutter in the evaporation chamber.

Other objects of the present invention will be obvious from the following description of the present invention.

BRIEF DESCRIPTION OF THE DRAWINGS

FIG. 1 shows an overall drawing illustrating one embodiment of the device according to the present invention and.

DESCRIPTION OF THE PREFERRED EMBODIMENT

Figure 1:
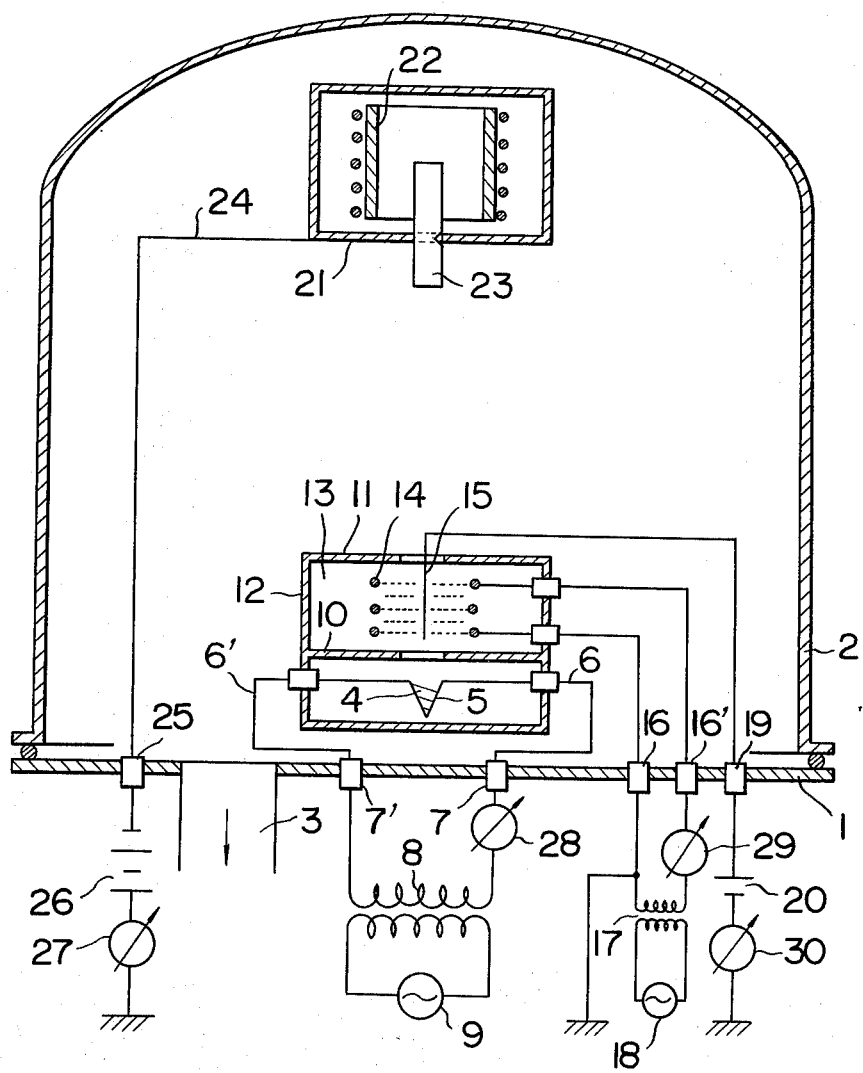

In the device of the present invention shown in FIG. 1, the evaporation chamber is constructed by combining with gas sealing means a bottom plate 1 and a bell jar 2: and also an exhaust vent 3 formed on the bottom plate 1 is connected to a vacuum pump (not shown in the drawing). In operation the interior of the bell jar 2 is maintained at a high degree of vacuum (about $10^{-6}$ Torr). At the lower part of the interior of the evaporation chamber, a crucible 5 for accommodating the evaporation source 4 is disposed. Lead wires 6,6' of the resistance heating type are connected to the crucible 5 and exit the evaporation chamber through insulated bushings 7,7' and are connected to an electric power source 9 for heating through a transformer 8.

Immediately above the crucible 5, an ionization chamber 13 is formed which includes a pair of upper and lower plates 11 and 10 having holes at their center portions for passage of evaporated particles and a cylindrical side plate 12 connecting said plates.

In the ionization chamber 13, a coil-shaped filament 14 for the emission of electrons is provided and is perpendicular to an axis of the chamber. Also, at its center portion, an anode 15 for current collection is concentrically installed. Both terminals of the filament 14 for emission of electrons are connected to an electric power source 18 through a transformer 17 after the terminals exit from the evaporation chamber through insulated bushings 16, 16'. Furthermore, the anode 15 for current collection exits from the evaporation chamber through an insulated bushing 19 and is connected to a positive pole of an electric power source 20 provided for current collection. The negative pole of the electric power source 20 for current collection and one of the terminals of the filament 14 for emission of electrons are connected to electrical ground, thereby forming a loop.

At the upper part of the evaporation chamber, a holder 21 which supports the body to be plated and which also serves as an accelerating electrode is disposed in a perpendicular direction to the bottom plate 1 at a predetermined elevated position over the ionization chamber 13. In this embodiment, a built-in type heater 22 is illustrated, and the body to be plated (for example, rock salt) is held, and at the same time, its temperature is controlled in a proper range. The other terminal of a high tension insulated conductor 24 which also serves as a support strut is connected to the holder 21, exits from the evaporation chamber through an insulated bushing 25, and is connected to the negative pole of an electric power source 26 of DC high tension for acceleration of the particles. The positive pole of the high tension electric power source 26 is grounded. In the drawing, reference numerals 27 – 30 denote ammeters to be provided according to requirement.

In the device according to the present invention having the foregoing construction, the evaporation source material 4 accommodated in the crucible 5, for example, Ar, Ag, Cu and the like is heated and evaporated by the electric power from the electric power source 9. The evaporated particles enter the interior of the ionization chamber 13 through the central hole of the plate 10 and rise inside of the coiled shaped filament 14. The filament 14 is heated by the electric power from the electric power source 18, and a voltage is impressed between the filament 14 and the anode 15 for current collection, said latter anode being made positive. Therefore the thermions emitted from the former move towards the latter and travel in a radial direction to form an electron shower. Accordingly, as described in the foregoing, the evaporated particles rising inside of the filament 14 collided with the electrons during the rising process and are ionized. The ionized evaporated particles (in this embodiment, the particles have positive polarity) are subjected to the action of the acceleration field due to the DC high tension applied to the holder 21, and collided with and adhere to body 23 to be plated mounted in holder 21.

Figure 2:
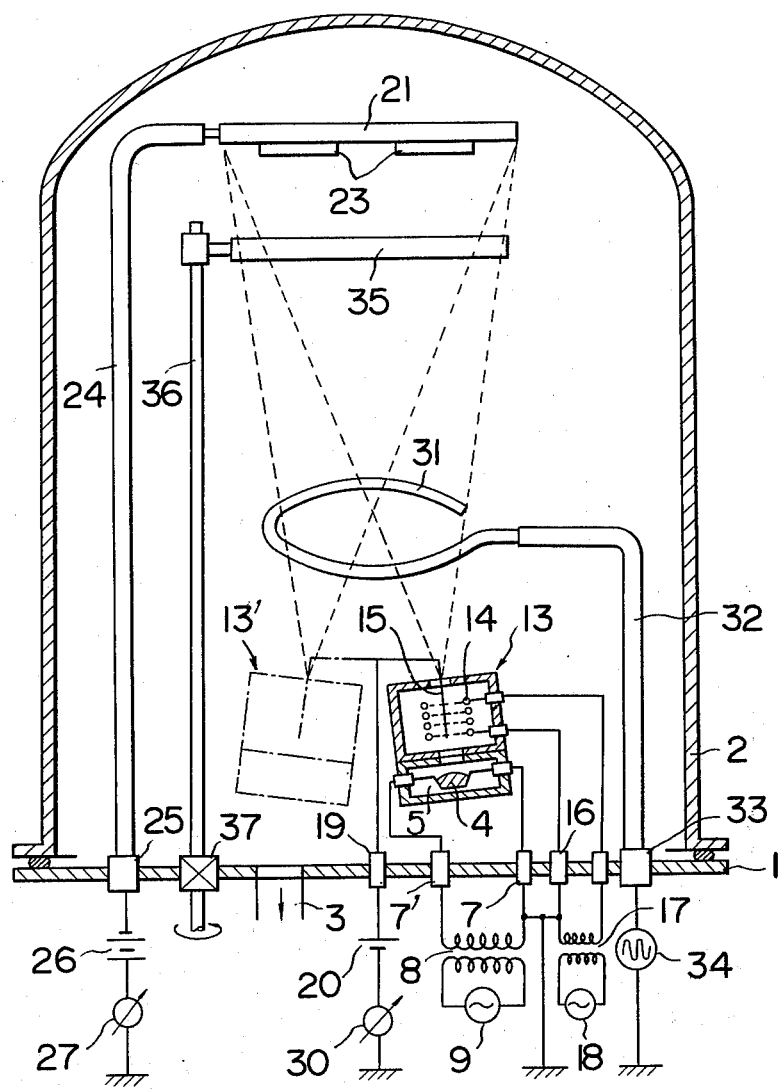
FIG. 2 shows an overall drawing illustrating another embodiment of the device according to the present invention.

Next, the embodiment of the device according to the present invention shown in FIG. 2 will be described in detail. In FIG. 2, corresponding members identical with those used in FIG. 1 are given the same symbols.

The evaporation chamber is comprised of the bottom plate 1 and the bell jar 2, and a plurality of ionization chambers 13 (in this embodiment, two chambers, with one shown in dotted line form in the drawing) having identical construction including crucibles 5 (the other crucible is in dotted line form in the drawing) are disposed in the vicinity of the bottom plate 1. The construction of each of the ionization chambers is similar to FIG. 1. Each chamber is comprised of a pair of upper and lower plates having evaporated particle entrance and exiting holes and a cylindrical side plate connecting the plates and the interior of the ionization chamber, a filament 14 for emission of electrons and an anode 15 for current collection. The ionization chambers are mounted slightly inclined so that the axis of each chamber is directed toward the center portion of the holder 21.

Above the ionization chambers 13 and 13', a high frequency coil 31 is disposed in the crossing portion of the evaporated particles moving or being transferred toward the holder from the chambers, and thus is located in coexistence region of evaporated particles from both sources. Reference number 32 denotes an insulated conductor which serves as a strut for supplying electric power and supporting the coil 31, and its lower end exits from the evaporation chamber through an insulated bushing 33 and is connected to a high frequency electric power source 34.

Between the high frequency coil 31 and the holder 21, a shutter 35 is disposed. The lower end of a supporting bar 36 that supports the shutter 35 exits from the evaporation chamber through a gas tight bearing 37. The supporting bar 36 and the shutter 35 are arranged to rotate by manipulation of a handle (not shown in the drawing) mounted external to the chamber.

In the device shown in FIG. 2 having the foregoing construction, the crucibles which are respectively disposed at the undersides of the ioniation chambers 13, 13' can accommodate different kinds of evaporation sources 4. After the body 23 to be plated is mounted at a suitable position on the holder 21, a vacuum pump (not shown in the drawing) that is connected to an exhaust vent 3 is operated to generate a high degree of vacuum in the evaporation chamber ($10^{-5}$ Torr or less).

Next, the DC high tension is impressed without impressing the crucible heater voltage and the high frequency voltage in order to effect ion bombardment. With this operation, the cleaning of the body to be plated is carried out and thereafter various kinds of electric power source circuits are put into operation. As a result, the evaporated particles resulting from the evaporation source enter into the ionization chambers 13, 13' and when the particles pass the inside of the filaments 14 for emission of electrons, the particles are bombarded with the electron shower so as to be ionized. As described, the ionized evaporated particles receive the action of the acceleration field by the DC high tension electric power source 26 and move toward the holder 21, but in the crossing portion of the ionized particles, a high frequency excitation region is formed by the high frequency coil 31. Therefore, the ionized particles of different kinds passing there form compounds and are adhered on the surface of the body 23 to be plated. The kinds of the compounds may be selected in various ways according to the particular combination of evaporation sources, but for example, compounds of III – V groups, e.g. InSb, GaAs, GaP can be formed.

It is to be noted when the adhesion range of the evaporated particles and the amount of adhesion are controlled during the ion plating process, the shutter 35 may be rotated at a proper angle by the supporting bar 36.

Accordingly, with respect to the embodiments of the present invention illustrated in FIGS. 1 and 2, the construction and operation of a generic device according to the present invention has been described in detail.

As will be obvious from the foregoing description, in the device of the present invention, as the interior of the evaporation chamber is maintained at high vacuum ($10^{-5}$ Torr or less), and therefore there, consequently is no deterioration of the film due to the incorporation of impurities and as a result, high quality films can be obtained. Also, when the evaporated particles pass between the anode and the filament, the ionization of the particles is carried out in the ionization chamber by the electron shower moving from the filament toward the anode, and therefore, there is no chance of causing back sputtering or overheating of the body to be plated as experienced in the case of conventional glow discharge plating.

Moreover, the ionization of the evaporated particles can be easily and accurately controlled by causing the particles to receive controlled filament current and anode voltage, and thus the ion plating can be carried out constantly at optimum conditions.

Also, with the use of a plurality of different kinds of evaporation sources, it is possible to form a compound film on the body to be plated, and moreover, with the joint use of the high frequency coil, the ionized particles themselves are allowed to form chemical bonds in the high frequency excitation region, and the compound ion plating can be easily materialized.

According to the present invention, as the temperature of the body to be plated seldom rises, and therefore, for example, organic materials such as photographic film base or plastic sheet or wood which tends to be destroyed by heat can be utilized with the device of the present invention. Also, by using the device of the present invention, electroplating waste solutions, offensive odors or other sources of public nuisance are not generated at all, and moreover, a film having adhesion strength equivalent to the film formed by conventional electrolytic plating can be formed so that the present invention will be useful in the elimination of the public nuisance associated with electroplating plants.

What I claim is:

1. Apparatus for plating a compound film of particles on the surface of a body comprising, in combination: an evaporation chamber adapted to be connected to a source of high vacuum; a plurality of evaporation means disposed in said evaporation chamber including: a plurality of crucibles for accommodating different kinds of evaporant materials, each of said crucibles having a top opening; an ionization chamber mounted in superimposed position over each of said crucibles, each of said ionization chambers having a passageway therethrough and connected with said top openings, each of said ionization chambers having a cylindrical coil-shaped filament for emitting electrons and an anode concentrically mounted within said filament for attracting said electrons, said filament and anode being disposed in said passageway; a high frequency coil being disposed in a superimposed relationship over said ionization chambers, said coil being connected to a high frequency electric power source located outside of said evaporation chamber; and a holder for supporting said body in a superimposed relationship over said high frequency coil and connected to a high tension electric power source located outside of said evaporation chamber; each associated evaporation means and ionization chamber forming a unit, each said unit being mounted with its axis tilted with respect to a vertical axis, said tilted axis being directed towards a substantially central portion of said holder.

2. An ion plating device, comprising, in combination: an evaporation chamber adapted to be connected to a source of high vacuum; evaporation means disposed in said evaporation chamber including a plurality of crucibles for accommodating different kinds of evaporant materials, a holder for a body to be plated disposed inside of said evaporation chamber, said holder being connected to a high tension electric power source; a plurality of ionization chambers disposed between said evaporation means and said holder; each of said ionization chambers having a cylindrical coil-shaped filament for emission of electrons and an anode concentrically installed within said filament for attracting said electrons disposed in the passage of evaporant being generated by said evaporation means; whereby the evaporant being ionized by said electrons being attracted to said anode; and a high frequency coil being superimposed in a higher plane and overlying said ionization chambers, said coil being connected to a high frequency electric power source.

* * * * *